United States Patent
Stelmakh et al.

(10) Patent No.: US 10,089,226 B2
(45) Date of Patent: Oct. 2, 2018

(54) SYSTEMS AND METHODS FOR IMMEDIATE PHYSICAL ERASURE OF DATA STORED IN A MEMORY SYSTEM IN RESPONSE TO A USER COMMAND

(71) Applicant: SanDisk Technologies LLC, Plano, TX (US)

(72) Inventors: Konstantin Stelmakh, Netanya (IL); Gabi Brontvein, Rishon le-Tziyion (IL); Menahem Lasser, Kochav Yair (IL); Long Cuu Pham, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/480,996

(22) Filed: Apr. 6, 2017

(65) Prior Publication Data
US 2017/0212833 A1    Jul. 27, 2017

Related U.S. Application Data

(62) Division of application No. 14/289,185, filed on May 28, 2014, now Pat. No. 9,658,788.

(51) Int. Cl.
    *G06F 12/02* (2006.01)
    *G06F 3/06* (2006.01)
    *G11C 16/16* (2006.01)

(52) U.S. Cl.
    CPC ........ *G06F 12/0246* (2013.01); *G06F 3/0623* (2013.01); *G06F 3/0652* (2013.01); *G06F 3/0659* (2013.01); *G06F 3/0679* (2013.01); *G11C 16/16* (2013.01); *G06F 2212/7205* (2013.01)

(58) Field of Classification Search
    CPC ...... G06F 3/062; G06F 3/0623; G06F 3/0652; G06F 3/0658; G06F 3/0659; G06F 3/0679; G06F 21/78; G06F 21/79; G06F 12/0246; G06F 12/1416; G06F 12/1425; G06F 12/14; G06F 2212/7205; G11C 16/16
    See application file for complete search history.

(56) References Cited

U.S. PATENT DOCUMENTS

| | | | |
|---|---|---|---|
| 5,546,561 A | 8/1996 | Kynett et al. | |
| 5,663,909 A * | 9/1997 | Sim ........................ | G11C 16/16 365/185.12 |

(Continued)

FOREIGN PATENT DOCUMENTS

CN    203204604 U  *  9/2013

*Primary Examiner* — Michael Krofcheck
(74) *Attorney, Agent, or Firm* — Vierra Magen Marcus LLP

(57) ABSTRACT

Systems and methods for immediate physical erasure of data in a memory system in response to a user command are disclosed. In one implementation, a memory system includes a non-volatile memory and a controller in communication with the non-volatile memory. The controller comprises a processor that is configured to receive from a host in communication with the memory system, a destruct command that indicates a user request to make the memory system inoperable. The processor is further configured to perform one or more operations to render the memory system inoperable in response to the destruct command received from the host.

16 Claims, 10 Drawing Sheets

(56) References Cited

U.S. PATENT DOCUMENTS

| | | | |
|---|---|---|---|
| 5,812,460 A * | 9/1998 | Kobatake | G11C 29/52 365/185.11 |
| 6,073,207 A | 6/2000 | Ideta | |
| 6,304,497 B1 | 10/2001 | Roohparvar | |
| 2001/0000816 A1 | 5/2001 | Baltar | |
| 2002/0166061 A1 | 11/2002 | Falik et al. | |
| 2003/0225962 A1* | 12/2003 | Hirosawa | G06F 21/79 711/103 |
| 2004/0034861 A1* | 2/2004 | Ballai | G06F 8/65 719/321 |
| 2004/0233714 A1* | 11/2004 | Morikawa | G11C 7/22 365/185.04 |
| 2006/0184718 A1* | 8/2006 | Sinclair | G06F 3/0608 711/103 |
| 2007/0118681 A1 | 5/2007 | Xiong | |
| 2007/0271494 A1 | 11/2007 | Gorobets | |
| 2008/0112300 A1* | 5/2008 | Kumhyr | G11B 27/034 369/83 |
| 2008/0256288 A1 | 10/2008 | Matsuoka et al. | |
| 2010/0322020 A1 | 12/2010 | Kim | |
| 2015/0169243 A1 | 6/2015 | Mylly | |

* cited by examiner

SYSTEMS AND METHODS FOR IMMEDIATE PHYSICAL ERASURE OF DATA STORED IN A MEMORY SYSTEM IN RESPONSE TO A USER COMMAND

RELATED APPLICATION

The present application is a divisional of U.S. patent application Ser. No. 14/289,185, now U.S. Pat. No. 9,658,788, filed May 28, 2014, the entire contents of which is hereby incorporated by reference.

BACKGROUND

As computing devices have become increasing mobile, users are at greater risk of exposing sensitive information stored on the devices through loss or theft of the devices. To combat this risk, users desire the ability to quickly and securely erase personal information saved on computing devices and sometimes to render devices inoperable

SUMMARY

The present disclosure is directed to systems and methods for immediate physical erasure of data in a memory system in response to a user command. In one aspect, a memory system is disclosed. The memory system includes a non-volatile memory and a controller in communication with the non-volatile memory. The controller comprises a processor that is configured to receive, from a host in communication with the memory system, a destruct command that indicates a user request to make the memory system inoperable. The controller is further configured to perform one or more operations to render the memory system inoperable in response to the destruct command received from the host.

In another aspect, a method for securely erasing data stored in a non-volatile memory is disclosed. In the method, a controller in communication with a non-volatile memory of the memory system receives, from a host in communication with the memory, with a processor of the controller, a destruct command that indicates a user request to make the memory system inoperable. The processor then performs one or more operations to render the memory system inoperable in response to the destruct command received from the host.

In yet another aspect, a memory system is disclosed. The memory system includes a non-volatile memory and a controller in communication with the non-volatile memory. The controller comprises a processor that is configured to receive, from a host in communication with the memory, a user data destruct command that indicates a user request to erase all data stored in the non-volatile memory other than data stored in one or more memory blocks of the non-volatile memory to be preserved. The controller is further configured to perform one or more operations to erase data stored in the non-volatile memory other than data stored in the one or more memory blocks of the non-volatile memory in response to the user data destruct command received from the host.

In a further aspect, a method for securely erasing data stored in a non-volatile memory is disclosed. In the method, a controller in communication with a non-volatile memory of a memory system receives, from a host in communication with the memory system, with a processor of the controller, a user data destruct command that indicates a user request to erase all data stored in the non-volatile memory other than data stored in one or more memory blocks of the non-volatile memory to be preserved. The controller additionally performs one or more operations to erase data stored in the non-volatile memory other than data stored in the one or more memory blocks of the non-volatile memory in response to the user data destruct command received from the host.

DETAILED DESCRIPTION OF THE DRAWINGS

The present disclosure is directed to memory systems that provide the ability to users interacting with a host to send a destruct command to a memory system coupled with the host. The memory systems may utilize destruct commands such as a self-destruct command that results in the memory system becoming inoperable and/or a user data destruct command that results in the erasure of nearly all data stored in the memory system but the memory system remains operational.

Figure 1:
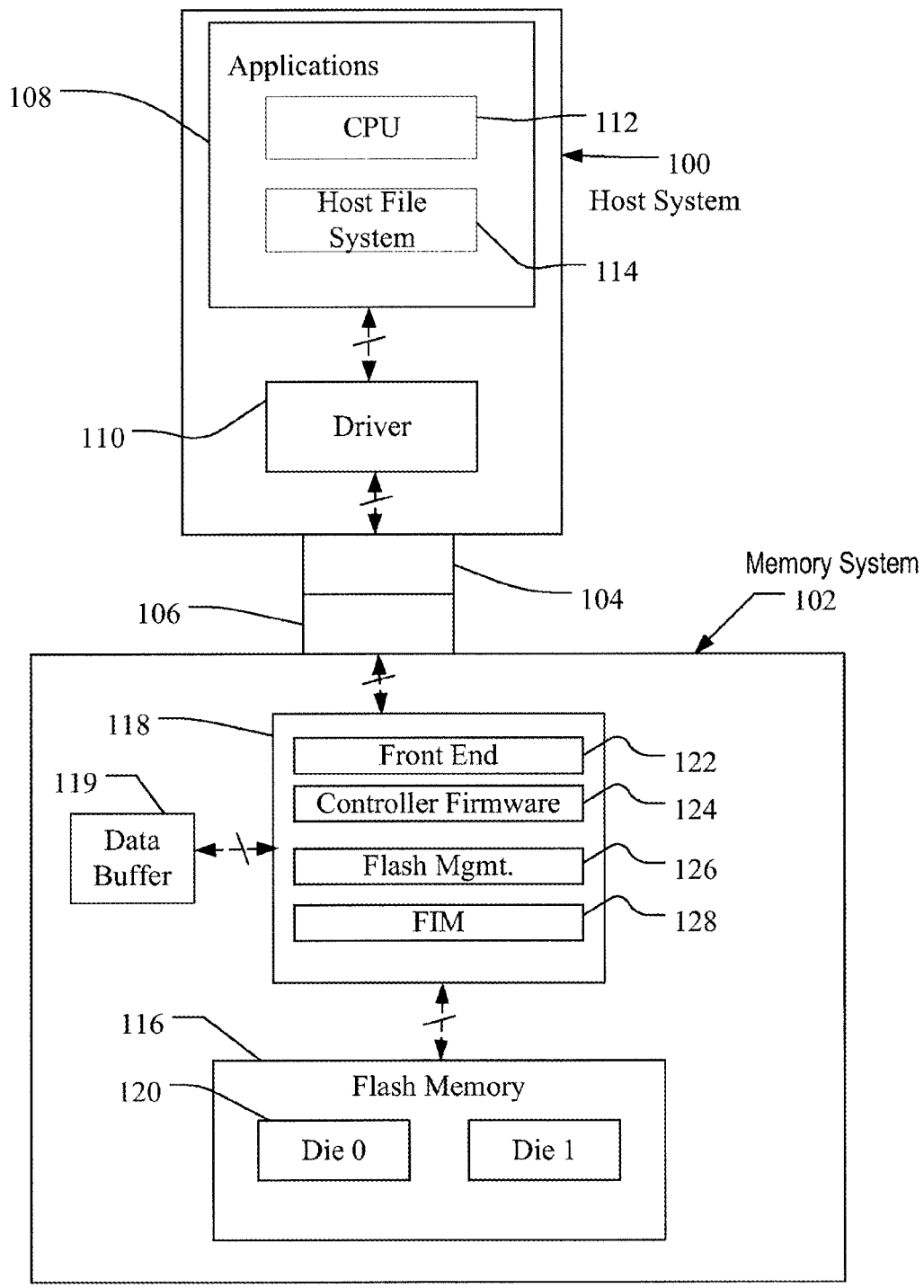
FIG. 1 illustrates a host connected with a memory system having a multi-bank non-volatile memory containing multiple die that may implement the disclosed methods for immediate physical erasure of data stored in a memory system in response to a user command.

A flash memory system suitable for use in implementing aspects of the invention is shown in FIGS. 1-6. A host system 100 of FIG. 1 stores data into and retrieves data from a memory system 102. The memory system may be, for example, flash memory embedded within the host, such as in the form of a solid state disk (SSD) drive installed in a personal computer or an iNAND installed in a device. Alternatively, the memory system 102 may be in the form of a card, for example, that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the memory system 102 internal to the host. SSD drives may be in the form of discrete modules that are drop-in replacements for rotating magnetic disk drives.

Semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

The host system 100 of FIG. 1 may be viewed as having two major parts, in so far as the memory system 102 is concerned, made up of a combination of circuitry and software. They are an applications portion 108 and a driver portion 110 that interface with the memory system 102. In a PC, for example, the applications portion 108 can include a processor 112 running word processing, graphics, control or other popular application software, as well as the file system 114 for managing data on the host 100. In a camera, cellular telephone or other host system that is primarily dedicated to perform a single set of functions, the applications portion 108 includes the software that operates the camera to take and store pictures, the cellular telephone to make and receive calls, and the like.

The memory system 102 of FIG. 1 may include non-volatile memory, such as flash memory 116; a system controller 118 that both interfaces with the host 100 to which the memory system 102 is connected for passing data back and forth and controls the memory 116; and one or more data buffers 119 coupled with the system controller 118 that the system controller 118 utilizes to buffer data before storing the data to the flash memory 116. The system controller 118 may convert between logical addresses of data used by the host 100 and physical addresses of the flash memory 116 during data programming and reading. The flash memory 116 may include any number of memory die 120 and two memory die are shown in FIG. 1 simply by way of illustration.

Functionally, the system controller 118 may include a front end 122 that interfaces with the host system, controller logic 124 for coordinating operation of the memory 116, flash management logic 126 for internal memory management operations such as garbage collection, and one or more flash interface modules (FIMs) 128 to provide a communication interface between the controller with the flash memory 116.

Figure 2:
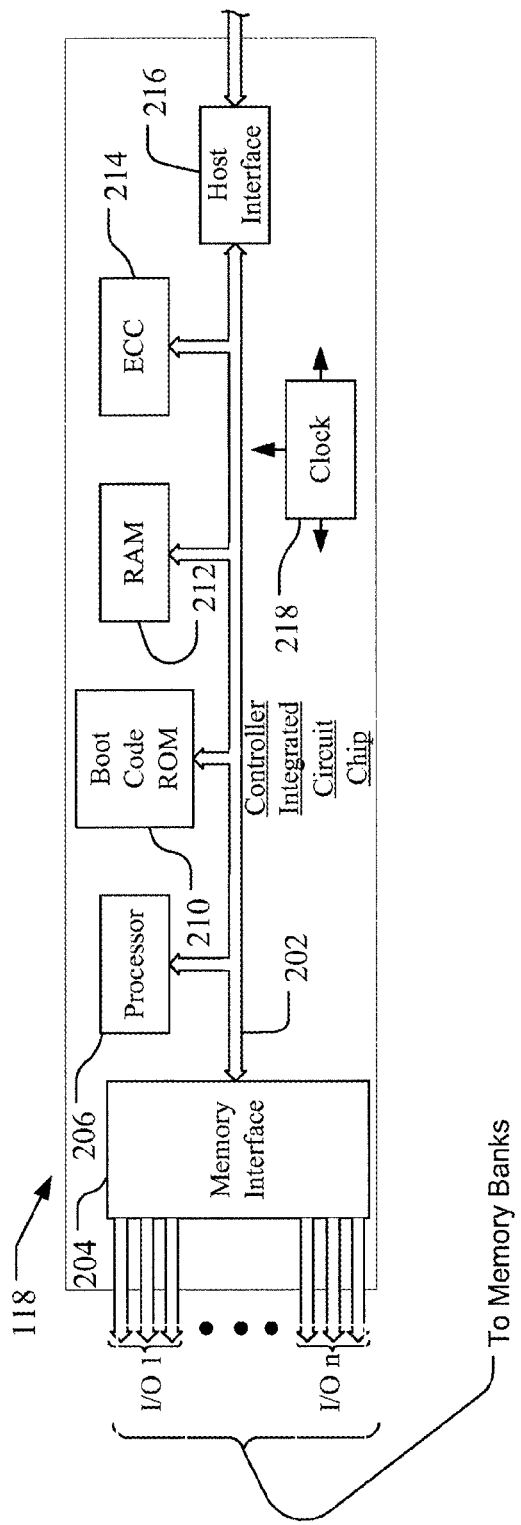
FIG. 2 is an example block diagram of an example flash memory system controller for use in the multiple die non-volatile memory of FIG. 1.

The system controller 118 may be implemented on a single integrated circuit chip, such as an application specific integrated circuit (ASIC) such as shown in FIG. 2. The processor 206 of the system controller 118 may be configured as a multi-core and multi-thread processor capable of communicating separately with each of the respective memory banks 120 via a memory interface 204 having I/O ports for each of the respective banks 120 in the flash memory 116. The system controller 118 may include an internal clock 218. The processor 206 communicates with an error correction code (ECC) module 214, a RAM buffer 212, a host interface 216, and boot code ROM 210 via an internal data bus 202.

Figure 3:
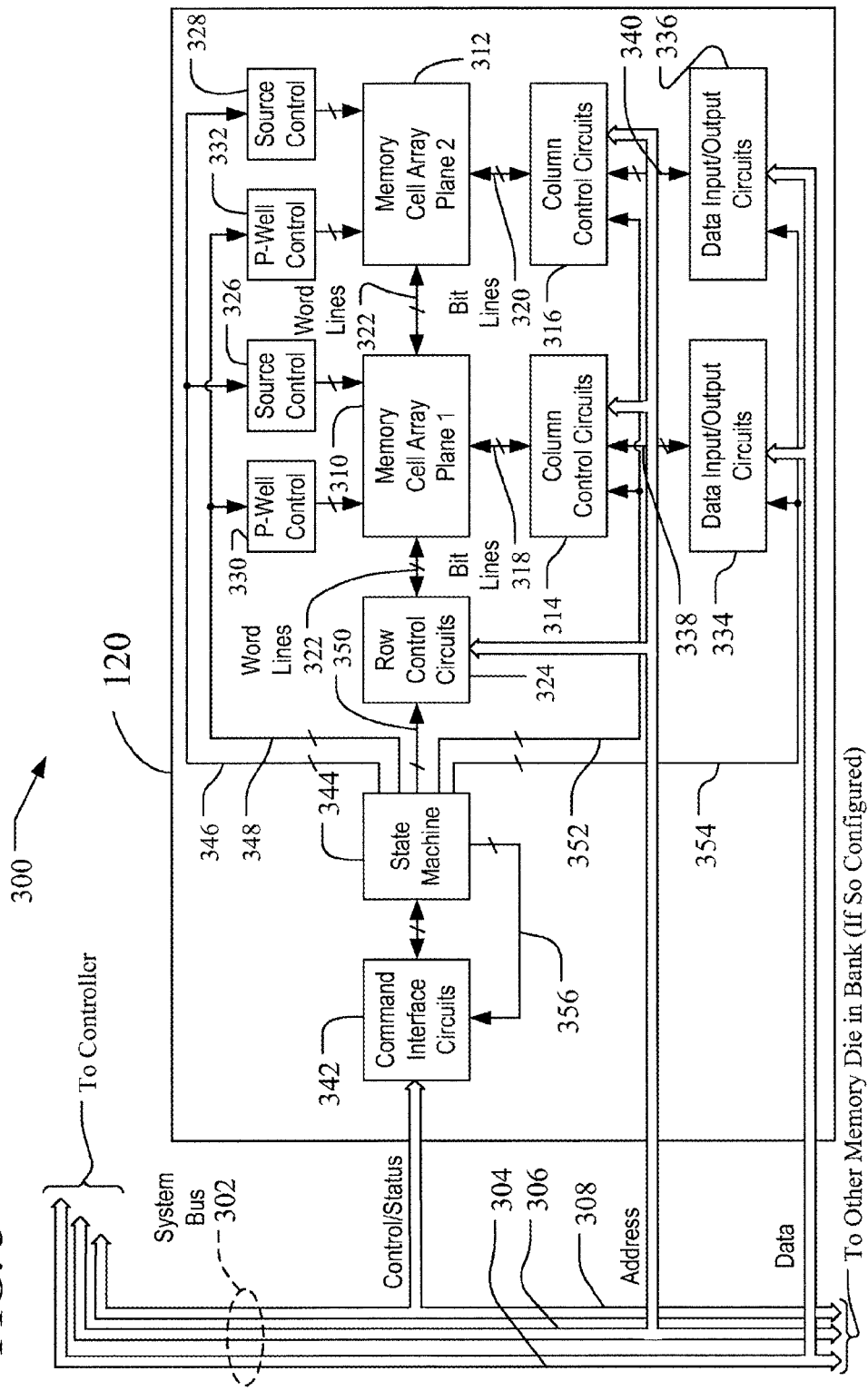
FIG. 3 is an example flash memory bank suitable as one of the non-volatile memory banks illustrated in FIG. 1.

Each die 120 in the flash memory 116 may contain an array of memory cells organized into multiple planes. FIG. 3 shows such planes 310 and 312 for simplicity but a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus 306. Source voltage control circuits 326 and 328 are also connected with the respective planes, as are p-well voltage control circuits 330 and 332. If the bank 300 is in the form of a memory chip with a single array of memory cells, and if two or more such chips exist in the system, data are transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Although the processor 206 in the system controller 118 controls the operation of the memory chips in each bank 120 to program data, read data, erase and attend to various housekeeping matters, each memory chip also contains some controlling circuitry that executes commands from the controller 118 to perform such functions. Interface circuits 342 are connected to the control and status portion 308 of the system bus 302. Commands from the controller 118 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 118 over the bus portion 308.

A NAND architecture of the memory cell arrays 310 and 312 is discussed below, although other architectures, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4a for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4A:
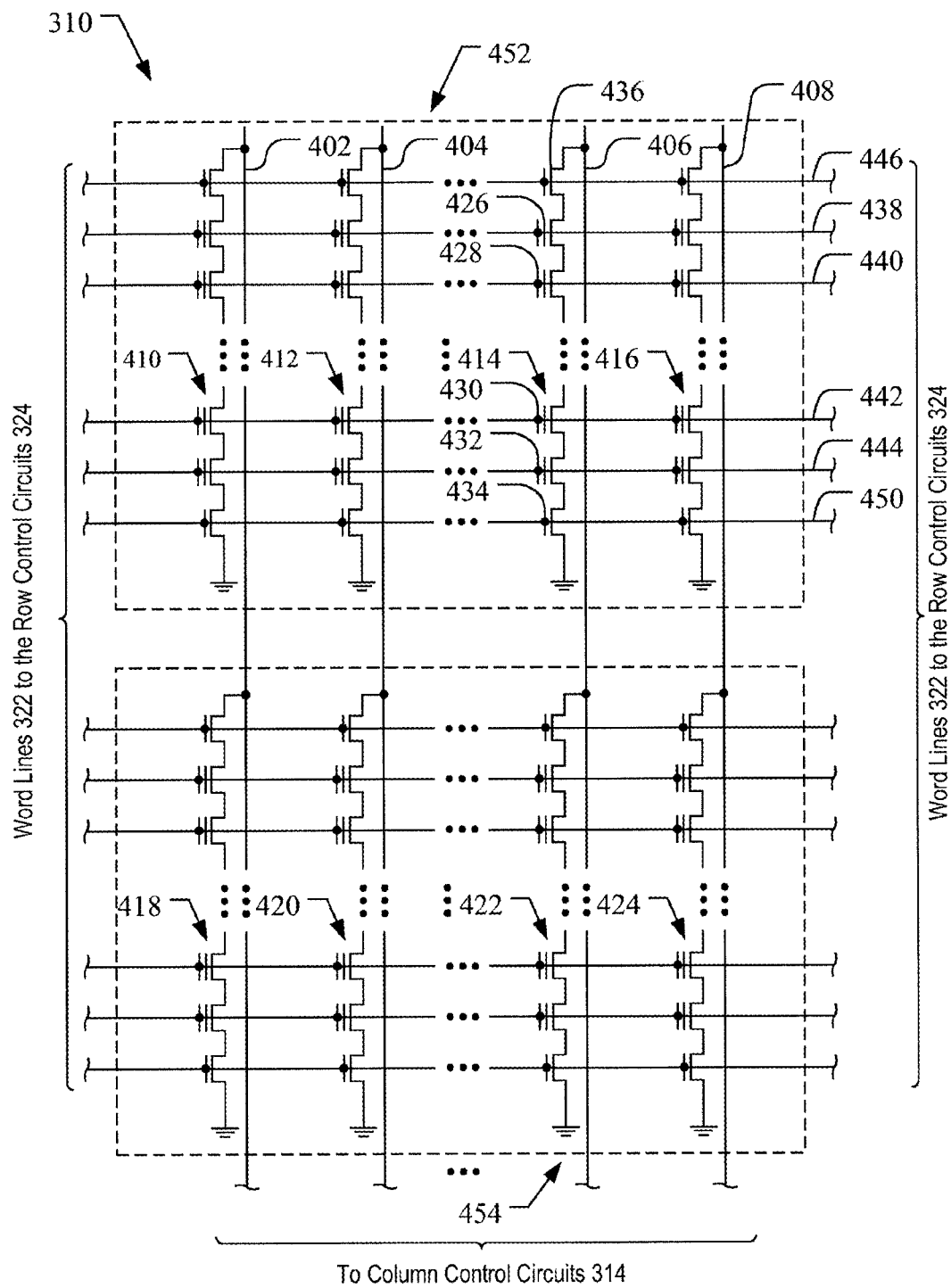
FIG. 4a is a representative circuit diagram of a memory cell array that may be used in the memory bank of FIG. 3.

Word lines 438-444 of FIG. 4a individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. However, in other implementations, the rows of a NAND array are not programmed in sequential order.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory. For example, binary flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 4B:
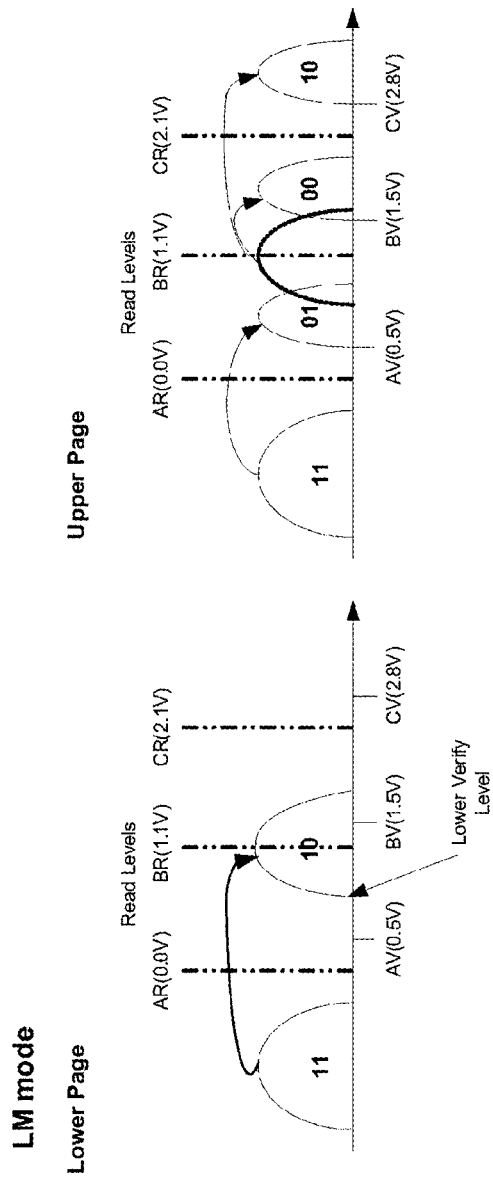
FIG. 4b illustrates charge levels in a MLC memory operated to store two bits of data in a memory cell.

FIG. 4b illustrates one implementation of the four charge levels used to represent two bits of data in a memory cell. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page.

For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Figure 5:
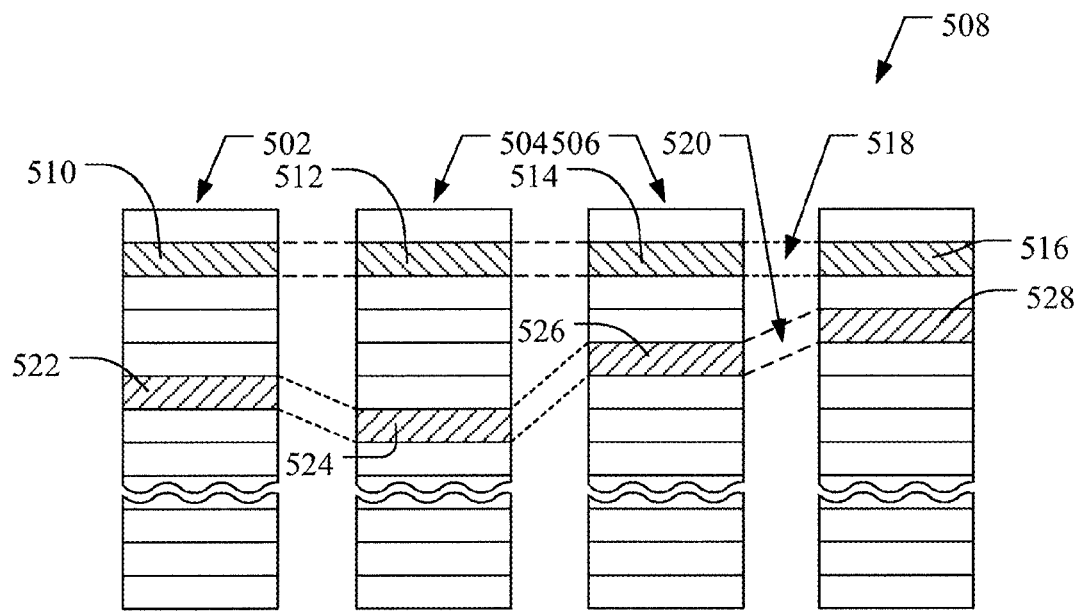
FIG. 5 illustrates an example physical memory organization of the memory bank of FIG. 3.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds of blocks in each plane.

As mentioned above, a block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 6:
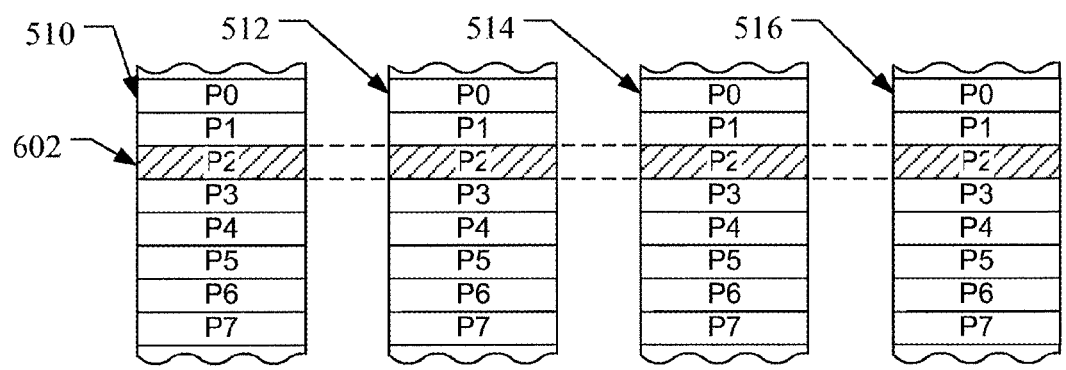
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. In the NAND architecture of FIG. 3, a page is formed of memory cells along a word line within a block. However, in order to increase the memory system operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks.

The flash management layer in the controller firmware of the memory card may choose to allocate memory in terms of allocation units called logical groups. Writes that are less than a logical group size will result in the controller copying valid data stored at an original physical location to a new physical location in addition to the controller writing incoming data. This overhead decreases performance and endurance of the memory. In order to minimize this overhead, a group of memory is used as update blocks. An update block is usually a memory of better endurance than the data blocks. i.e, if the data blocks have MLC memory, the update blocks have SLC memory. Writes that are less than a logical group may result in the controller directing data into the update blocks, and after consolidation, the controller may copy data at a later point in time from the update block to one or more program data blocks. The controller performs these actions based on the fact that the update blocks are more durable and there is more possibility of collecting the entire logical group of data in the update blocks before writing into the data blocks, thus reducing overhead in the MLC memory. It is also more desirable to retain frequently written data blocks in the update block for similar reasons.

As mentioned above, memory systems described in the present disclosure provide the ability for users to interact with hosts and send destruct commands to a memory system coupled with the host system. In some implementations, such as those discussed below with respect to FIGS. 7 and 8, the memory system may utilize a self-destruct command that results in the memory system becoming inoperable. Additionally or alternatively, the memory system may utilize a user data destruct command that results in the erasure of nearly all data stored in the memory system, but the memory system remains operational, as described below with respect to FIGS. 9 and 10.

Figure 7:
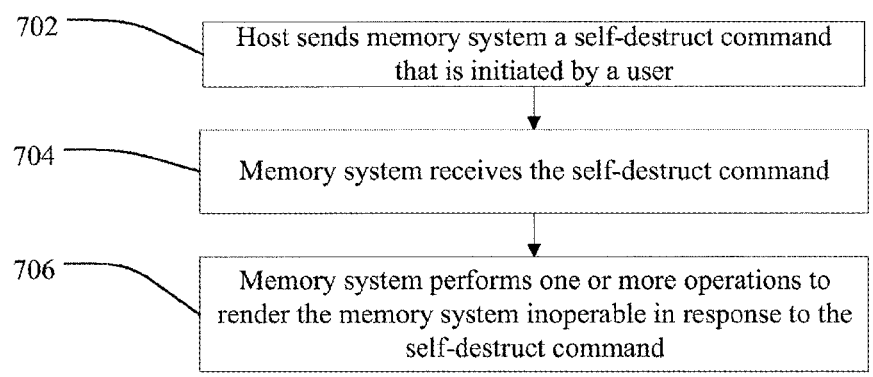
FIG. 7 is a flow chart of one implementation of a method for rendering a memory system inoperable in response to a self-destruct command.

FIG. 7 is a flow chart of one implementation of a method for rendering a memory system inoperable in response to a self-destruct command. The method begins at step 702 with a user interacting with a host to send a self-destruct command to a memory system that indicates a user request to make the memory system inoperable. At step 704, a controller of the memory system receives the self-destruct command, and step 706, the controller performs one or more operations to render the memory system inoperable in response to the self-destruct command received from the host.

In some implementations, the operations that the controller performs at step 706 may include operations such as physically erasing at least a portion of the non-volatile memory of the memory system; simultaneously erasing two or more memory blocks of the non-volatile memory that reside in a common plane; and/or physically erasing one or more memory blocks storing firmware executable by the controller and then after erasing the firmware, perform a self reset, where after the self reset, the memory system is inoperable.

In some implementations, the operations that the controller performs at step 706 may also include the controller selecting a first plurality of blocks, where each memory block of the first plurality of memory blocks is associated with a first characteristic of the memory blocks, and then simultaneously erasing data stored at the first plurality of memory blocks. The controller then selects a second plurality of memory blocks of the non-volatile memory, where each memory block of the second plurality of memory blocks is associated with a second characteristic of the memory block that is different from the first characteristic, and then simultaneously erasing data stored at the second plurality of memory blocks.

For example, when the controller receives the self-destruct command, the controller may select the even numbered memory blocks within the non-volatile memory; simultaneously erase data stored in the even numbered blocks; select the odd numbered memory blocks within the non-volatile memory; and then simultaneously erase data stored in the odd numbered memory blocks.

It should be appreciated that while the examples described above include a controller or a memory system operating in two loops with the selection and erasure of a first plurality of memory blocks and the selection and erasure of a second plurality of memory blocks, in other implementations, the controller or memory system may operate in any number of loops with the selection and erasure of more than two plurality of memory blocks.

Figure 8:
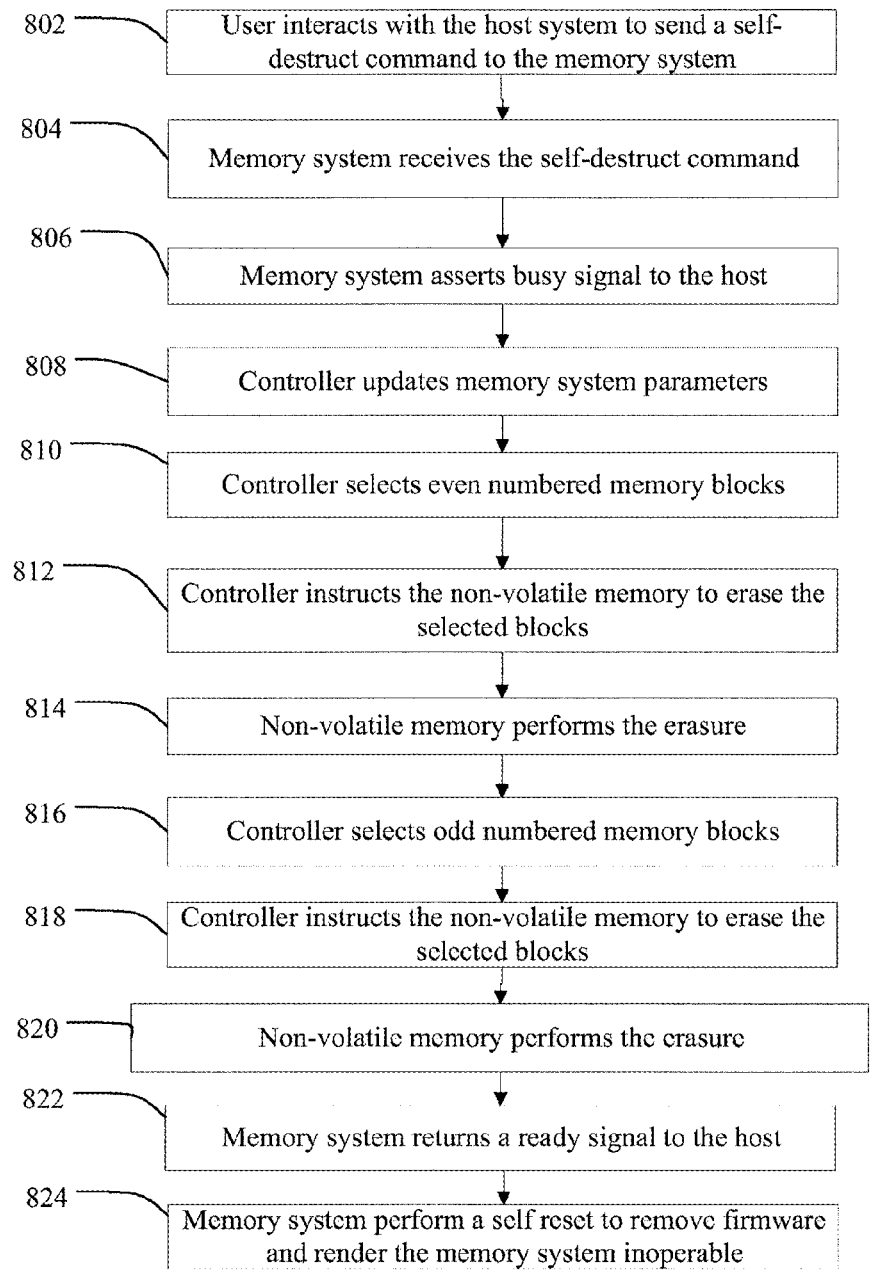
FIG. 8 is flow chart of an example implementation of a method for rendering a memory system inoperable in response to a self-destruct command.

FIG. 8 is flow chart of an example implementation of a method for rendering a memory system inoperable in response to a self-destruct command. At step 802, a user interacts with a host to send a self-destruct command to a memory system that indicates a user request to make the memory system inoperable.

At step 804, the controller receives the self-destruct command. In response, at step 806, the controller asserts a busy signal towards the host. At step 808, the controller updates NAND device parameters required for the simultaneous erasure of data stored in a non-volatile memory of the memory system.

At step 810, the controller selects all even numbered memory blocks of the non-volatile memory. At step 812, the controller instructs the non-volatile memory to simultaneously physically erase all of the selected memory blocks, and at step 814, the non-volatile memory performs the data erasure.

At step 816, the controller selects all odd numbered memory blocks of the non-volatile memory. At step 818, the controller instructs the non-volatile memory to simultaneously physically erase all of the selected memory blocks, and at step 820, the non-volatile memory performs the data erasure.

At step 822, the controller returns a ready signal to the host system after performing the data erasures. Finally, at step 824, the controller performs a self-reset to remove firmware from the memory system and render the memory system inoperable.

Those of skill in the art will appreciate that by performing the simultaneous erasure of groups of data blocks, the memory system is able quickly and securely erase data from the memory system and render the memory system inoperable when compared to traditional memory systems. For example, the described memory systems are able to quickly erase the data of the memory device without dependency on a capacity (~100 ms for the whole device) of the memory system by selecting a group of data blocks and then performing a simultaneous erasure of the selected group of data blocks. Moreover, the described memory systems are able to securely erase data from the memory system by performing a physical erasure of the data such that the data may not be recovered.

In other implementations, the memory system may select a first plurality of blocks of the non-volatile memory, where each memory block of the first plurality of memory blocks is associated with a first characteristic of the memory blocks, and then select a second plurality of memory blocks of the non-volatile memory where each memory block of the second plurality of memory blocks is associated with a second characteristic of the memory blocks that is different from the first characteristic. The processor of the memory system may then simultaneously erase data stored at the first plurality of memory blocks and simultaneously erase data stored at the second plurality of memory blocks.

While the methods described above erase all data within a memory system and render the memory system inoperable in response to a self-destruct command, in other conditions, a user may desire to securely erase a majority of the data stored in a non-volatile memory of a memory system but retain some of the data in the non-volatile memory so that the non-volatile memory remains operational. The systems and methods described below with respect to FIGS. 9 and 10 describe the utilization of a user data destruct command that provides this ability.

Figure 9:
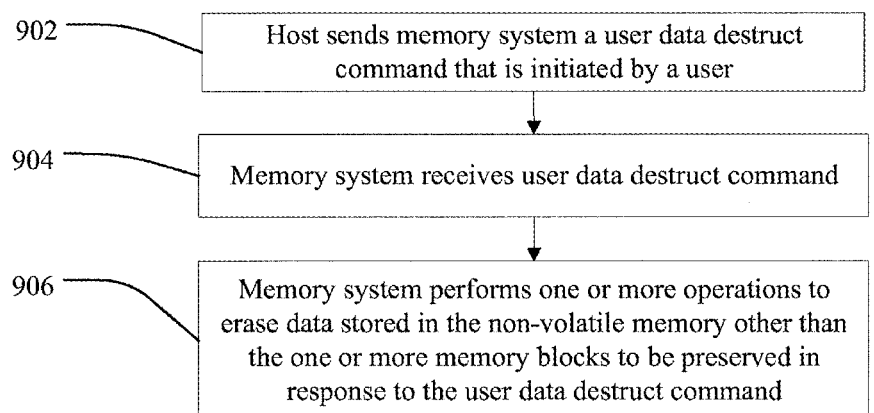
FIG. 9 is a flow chart of one implementation of a method for erasing data stored in a memory system in response to a user data destruct command.

FIG. 9 is a flow chart of one implementation of a method for erasing data stored in a memory system in response to a user data destruct command. The method begins at step 902 with a user interacting with a host to send a user data destruct command to a memory system that indicates a user request to erase all data stored in the non-volatile memory other than data stored in one or more memory blocks of the non-volatile memory to be preserved.

At step 904, a controller of the memory system receives the user data destruct command, and step 906, the controller performs one or more operations to erase data stored in the non-volatile memory other than data stored in the one or more memory blocks of the non-volatile memory in response to the user data destruct command received from the host.

In some implementations, the processor specifies the one or more memory blocks that are to be preserved. For example, to specify the one or more memory blocks that are to be preserved, the processor may set bits of a latch (also known as a buffer) of the non-volatile memory to indicate the memory blocks to be preserved. In other implementations, the one or more memory blocks to be preserved are pre-determined and contain firmware executable by the controller. In yet further implementations, the user indicates in the user data destruct command the one or more memory blocks to be preserved.

In some implementations, the operations that the controller performs at step 906 may include the controller selecting a first plurality of memory blocks of the non-volatile memory, where each memory block of the first plurality of memory blocks is associated with a first characteristic of the memory blocks; excluding from the first plurality of blocks any of the one or more memory blocks to be preserved; and then simultaneously erasing data stored at the first plurality of memory blocks.

The controller may further select a second plurality of memory blocks of the non-volatile memory, where each memory block of the second plurality of memory blocks is associated with a second characteristic of the memory blocks that is different from the first characteristic; exclude from the second plurality of blocks any of the one or more memory blocks to be preserved; and then simultaneously erase data stored at the second plurality of memory blocks.

For example, when the controller receives the user data destruct command, the controller may select the even numbered memory blocks within the non-volatile memory; exclude any even numbered memory blocks to be preserved from the selected even numbered memory blocks; and then simultaneously erase data stored at the selected even numbered memory blocks. Further, the controller may select the odd numbered memory blocks within the non-volatile memory; exclude any odd numbered memory blocks to be preserved from the selected odd numbered memory blocks; and then simultaneously erase data stored at the selected odd numbered memory blocks.

Figure 10:
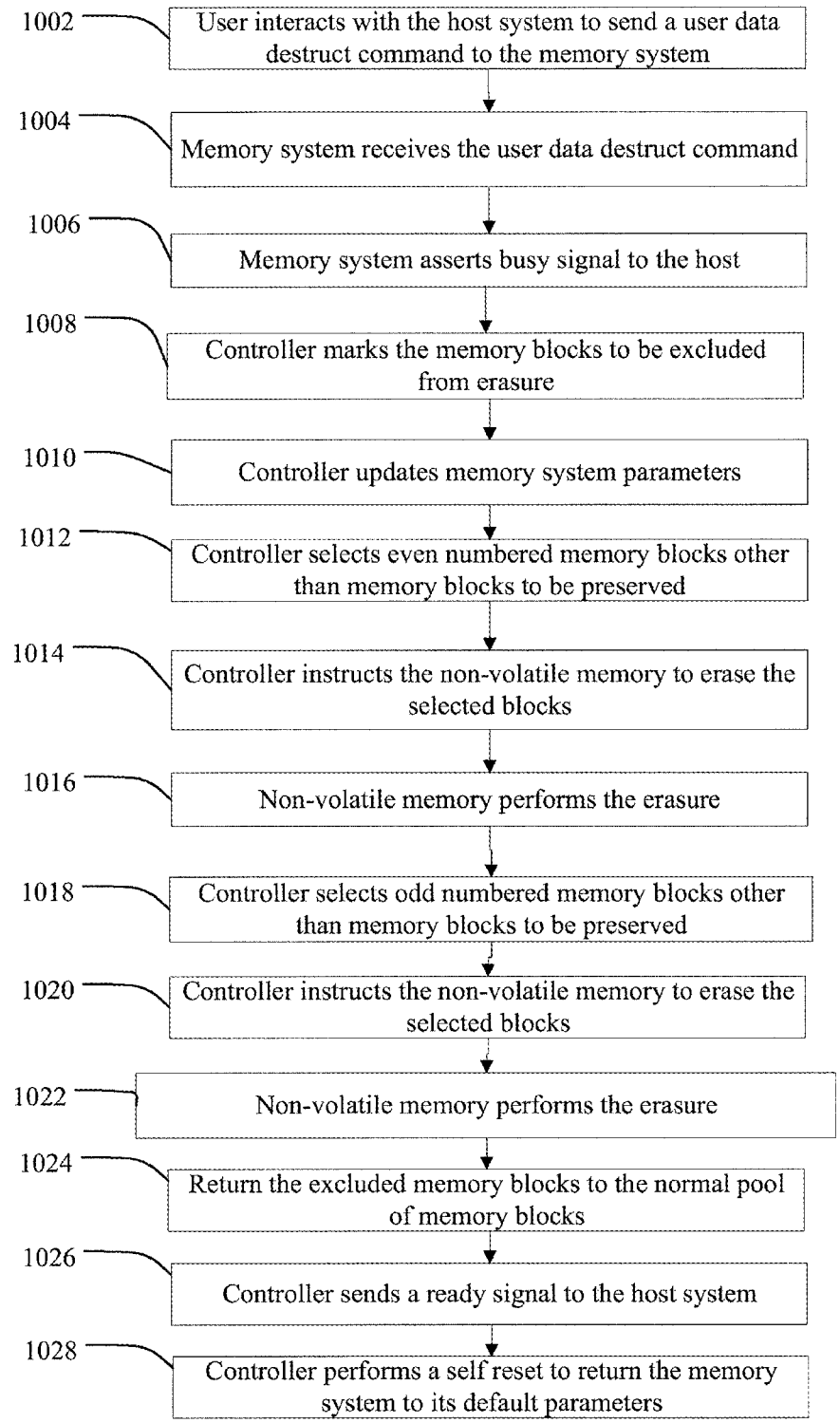
FIG. 10 is a flow chart of an example implementation of a method for erasing data stored in a memory system in response to a user data destruct command.

FIG. 10 is a flow chart of an example implementation of a method for erasing data stored in a memory system in response to a user data destruct command. The method begins at step 1002 with a user interacting with a host to send a user data destruct command to a memory system that indicates a user request to erase all data stored in the non-volatile memory other than data stored in one or more memory blocks of the non-volatile memory to be preserved.

At step 1004, a controller of the memory system receives the user data destruct command, and at step 1006 the controller asserts a busy signal to the host system. At step 1008, the controller marks the memory blocks to be excluded from the erasure. As discussed above, in some implementations the controller may specify the one or more memory blocks to be preserved. However, in other implementations, a user may indicate the one or more memory blocks to be preserved or the one or more memory blocks to be preserved may be predetermined.

At step 1010, the controller updates NAND device parameters required for simultaneous erasure. At step 1012, the controller selects all even memory blocks other than the one or more memory blocks to be preserved. At step 1014, the controller sends a command to the non-volatile memory that requests simultaneous physically erasure of the selected memory blocks. At step 1016, the non-volatile memory performs the erasure of the selected memory blocks.

At step 1018, the controller selects all odd memory blocks other than the one or more memory blocks to be preserved. At step 1020, the controller sends a command to the non-volatile memory that requests simultaneous physically erasure of the selected memory blocks. At step 1022, the non-volatile memory performs the erasure of the selected memory blocks.

At step 1024, the controller returns the memory blocks excluded from the erasure to the normal pool of memory blocks for utilization in the memory system. At step 1026, the controller sends a ready signal to the host system, and at step 1028, the controller performs a self reset to return the memory system to its default parameters.

Those of skill in the art will appreciate that by performing the simultaneous erasure of groups of data blocks, the memory system is able quickly and securely erase data from the memory system when compared to traditional memory systems. For example, the described memory systems are able to quickly (~100 ms for the whole device) erase the data of the memory device without dependency on a capacity of the memory system by selecting a group of data blocks and then performing a simultaneous erasure of the selected group of data blocks. Moreover, the described memory systems are able to securely erase data from the memory system by performing a physical erasure of the data such that the data may not be recovered.

In other implementations, the non-volatile memory may select a first plurality of memory blocks of the non-volatile memory, where each memory block of the first plurality of memory blocks is associated with a first characteristic of the memory blocks, and the non-volatile memory may select a second plurality of memory blocks of the non-volatile memory, where each memory block of the second plurality of memory blocks is associated with a second characteristic of the memory blocks that is different from the first characteristic. The processor of the memory system then excludes from the first plurality of blocks any of the one or more memory blocks to be preserved and simultaneously erases data stored at the selected first plurality of memory blocks. Further, the processor of the memory system excludes from the second plurality of blocks any of the one or more memory blocks to be preserved and erases data stored at the selected second plurality of memory blocks.

FIGS. 1-10 illustrate systems and methods for memory systems that provide users the ability to interact with a host to send a destruct command to the memory system coupled with the host. The memory systems may utilize a self-destruct command that results in the memory system becoming inoperable and/or a user data destruct command that results in the erasure of nearly all data stored in the memory system but the memory system remains operational.

It is intended that the foregoing detailed description be regarded as illustrative rather than limiting, and that it be understood that it is the following claims, including all equivalents, that are intended to define the spirit and scope of this invention.

The invention claimed is:

1. A memory system comprising:
  non-volatile memory; and
  a controller configured to:
    receive, from a host in communication with the memory system, a destruct command that indicates a user request to make the memory system inoperable; and
    perform one or more operations to render the memory system inoperable in response to the destruct command received from the host;
  wherein to perform the one or more operations to render the memory system inoperable, the controller is configured to:

select a first plurality of memory blocks of the non-volatile memory, where each memory block of the first plurality of memory blocks is an even physically-numbered memory block;
simultaneously erase data stored at the first plurality of memory blocks;
select a second plurality of memory blocks of the non-volatile memory, where each memory block of the second plurality of memory blocks is an odd physical-numbered memory block;
simultaneously erase data stored at the second plurality of memory blocks; and
after erasing the data stored at the first plurality of memory blocks and the data stored at the second plurality of memory blocks, perform a self reset, where after performing the self reset, the absence of data in the first and second plurality of memory blocks causes the memory system to be inoperable.

2. The memory system of claim 1, wherein to perform the one or more operations, the controller is configured to physically erase at least a portion of the non-volatile memory.

3. The memory system of claim 2, wherein to physically erase at least a portion of the non-volatile memory, the controller is configured to erase a memory block storing firmware executable by the controller.

4. The memory system of claim 2, wherein to physically erase at least a portion of the non-volatile memory, the controller is configured to simultaneously erase two memory blocks of the non-volatile memory that reside in a common plane.

5. The memory system of claim 1, wherein the non-volatile memory comprises three dimensional memory.

6. The memory system of claim 1, wherein the controller is embedded in the host.

7. The memory system of claim 6, wherein the non-volatile memory is positioned in a removable storage device configured to be removably connected with the host.

8. The memory system of claim 1, wherein the memory system is embedded in the host.

9. A method for making a non-volatile memory system inoperable, the method comprising:
in a controller in communication with a non-volatile memory of the memory system:
receiving, from a host in communication with the memory system, by a processor of the controller, a destruct command that indicates a user request to make the memory system inoperable; and
performing one or more operations to render the memory system inoperable in response to the destruct command received from the host;
wherein performing one or more operations to render the memory system inoperable comprises:
selecting a first plurality of memory blocks of the non-volatile memory, where each memory block of the first plurality of memory blocks is an even physically-numbered memory block;
simultaneously erasing data stored at the first plurality of memory blocks;
selecting a second plurality of memory blocks of the non-volatile memory, where each memory block of the second plurality of memory blocks is an odd physical-numbered memory block;
simultaneously erasing data stored at the second plurality of memory blocks; and
after erasing the data stored at the first plurality of memory blocks and the data stored at the second plurality of memory blocks, performing a self reset, where after performing the self reset, the absence of data in the first and second plurality of memory blocks causes the memory system to be inoperable.

10. The method of claim 9, wherein performing the one or more operations comprises physically erasing at least a portion of the non-volatile memory.

11. The method of claim 10, wherein physically erasing at least a portion of the non-volatile memory comprises erasing a memory block storing firmware executable by the controller.

12. The method of claim 10, wherein physically erasing at least a portion of the non-volatile memory comprises simultaneously erasing two memory blocks of the non-volatile memory that reside in a common plane.

13. The method of claim 9, where the non-volatile memory of the memory system comprises three dimensional memory.

14. The method of claim 9, where the controller is embedded in the host.

15. A memory system comprising:
non-volatile memory; and
means for receiving, from a host in communication with the memory system, a destruct command that indicates a user request to make the memory system inoperable; and
means for performing one or more operations to render the memory system inoperable in response to the destruct command received from the host;
wherein to perform the one or more operations to render the memory system inoperable, the means for performing the one or more operations comprises:
means for selecting a first plurality of memory blocks of the non-volatile memory, where each memory block of the first plurality of memory blocks is an even physically-numbered memory block;
means for simultaneously erasing data stored at the first plurality of memory blocks;
means for selecting a second plurality of memory blocks of the non-volatile memory, where each memory block of the second plurality of memory blocks is an odd physical-numbered memory block;
means for simultaneously erasing data stored at the second plurality of memory blocks; and
means for, after erasing the data stored at the first plurality of memory blocks and the data stored at the second plurality of memory blocks, performing a self reset, where after performing the self reset, the absence of data in the first and second plurality of memory blocks causes the memory system to be inoperable.

16. The memory system of claim 15, wherein at least one of the first plurality of memory blocks or the second plurality of memory blocks stores firmware executable by a controller of the memory system.

* * * * *